(12) United States Patent
Fang et al.

(10) Patent No.: US 12,260,972 B2
(45) Date of Patent: Mar. 25, 2025

(54) MICRO-NANO WIRE MANUFACTURING DEVICE AND MICRO-NANO STRUCTURE

(71) Applicant: XI'AN JIAOTONG-LIVERPOOL UNIVERSITY, Jiangsu (CN)

(72) Inventors: Yuxiao Fang, Jiangsu (CN); Chun Zhao, Jiangsu (CN); Cezhou Zhao, Jiangsu (CN); Li Yang, Jiangsu (CN)

(73) Assignee: XI'AN JIAOTONG-LIVERPOOL UNIVERSITY, Jiangsu (CN)

( * ) Notice: Subject to any disclaimer, the term of this patent is extended or adjusted under 35 U.S.C. 154(b) by 1012 days.

(21) Appl. No.: 17/049,179

(22) PCT Filed: Feb. 12, 2020

(86) PCT No.: PCT/CN2020/074811
§ 371 (c)(1),
(2) Date: Oct. 20, 2020

(87) PCT Pub. No.: WO2020/173301
PCT Pub. Date: Sep. 3, 2020

(65) Prior Publication Data
US 2021/0257130 A1   Aug. 19, 2021

(30) Foreign Application Priority Data

Feb. 28, 2019   (CN) .......................... 201910149242.X

(51) Int. Cl.
*H01B 13/32*   (2006.01)
*H01B 1/12*   (2006.01)
(Continued)

(52) U.S. Cl.
CPC ............ *H01B 13/322* (2013.01); *H01B 1/12* (2013.01); *H01B 13/0003* (2013.01); *B82Y 40/00* (2013.01); *H01L 29/0669* (2013.01)

(58) Field of Classification Search
None
See application file for complete search history.

(56) References Cited

U.S. PATENT DOCUMENTS

2005/0066890 A1 *   3/2005   Wetzel ................ B05B 13/0452
                                                                118/313

FOREIGN PATENT DOCUMENTS

CN   102344115 A   2/2012
CN   103612391 A   3/2014
(Continued)

OTHER PUBLICATIONS

Liu et al "Bio-Inspired Direct Patterning Functional Nanothin Microlines: Controllable Liquid Transfer" (ACS Nano 2015, vol. 9(4), pp. 4362-4370).*

(Continued)

*Primary Examiner* — Charles Capozzi

(57) ABSTRACT

Provided are a micro-nano wire manufacturing device and a micro-nano structure. The micro-nano wire manufacturing device includes a liquid-phase nanomaterial storage device and a micro-nano wire applying mechanism. The liquid-phase nanomaterial storage device is provided with a liquid outlet. The micro-nano wire applying mechanism is provided in one-to-one correspondence with the liquid outlet. The micro-nano wire applying mechanism includes at least two flexible wires. The roots of the flexible wires are secured to the liquid-phase nanomaterial storage device. One ends of the two flexible wires hang down to a substrate and abut against each other. The range of the angle between the projections of the two flexible wires on the substrate is 1° to 5°.

9 Claims, 1 Drawing Sheet

(51) Int. Cl.
    *H01B 13/00*     (2006.01)
    *B82Y 40/00*     (2011.01)
    *H01L 29/06*     (2006.01)

(56) References Cited

FOREIGN PATENT DOCUMENTS

| | | |
|---|---|---|
| CN | 103660540 A | 3/2014 |
| CN | 105185910 A | 12/2015 |
| CN | 107399713 A | 11/2017 |
| CN | 108264017 A | 7/2018 |
| CN | 109807907 A | 5/2019 |
| CN | 209850936 U | 12/2019 |
| JP | 2012222019 A | 11/2012 |
| KR | 20130036550 A | 4/2013 |

OTHER PUBLICATIONS

Jiang et al Chinese Brushes: Controllable Liquid Transfer in Ratchet Conical Hairs (Adv. Mater. 26, 4889-4894 (2014)) as applied to claim 4 above, and in further view of Wetzel (US 20050066890).*
Office Action and Search Report in CN 201910149242X (Oct. 28, 2023).
ISR for PCT/CN2020/074811 (May 9, 2020).

* cited by examiner

MICRO-NANO WIRE MANUFACTURING DEVICE AND MICRO-NANO STRUCTURE

This disclosure claims priority to Chinese Patent Application No. 201910149242.X filed with the China Patent Office on Feb. 28, 2019, the disclosure of which is incorporated herein by reference in its entirety.

TECHNICAL FIELD

This application relates to a technology in the microelectronics field, for example, to a micro-nano wire manufacturing device and a micro-nano structure.

BACKGROUND

Micro-nano patterns or micro-nano wires manufactured on a specific substrate by using liquid-phase nanomaterials have great research prospects in integrated circuits, optical microelectronic devices, biosensors, and biodetectors. The performance of devices in these fields depends largely on one-dimensional micro-nano patterns or micro-nano wires. For example, micro-nano patterns or micro-nano wires made of organic materials can improve the balance of electron and hole transfer, thereby improving the performance of the integrated circuits and the optical microelectronic devices.

In recent decades, there are many methods for manufacturing one-dimensional micro-nano patterns or micro-nano wires, such as photolithography, micro-contact printing, inkjet printing, etc., However, these methods are costly and have a complex process. Moreover, micro-nano patterns that can be manufactured by using these methods are limited. Usually only some designed patterns can be transferred to the substrate. In addition, it is difficult to manufacture nanoscale patterns by using these methods. In the related art, the drip method is generally used to manufacture nanoscale patterns. However, the drip method has a low success rate and a small area in manufacturing micro-nano wires, and the shapes, directions, and positions of the micro-nano wires are random and uncontrollable in the drip method.

SUMMARY

This application proposes a micro-nano wire manufacturing device and a micro-nano structure in view of the preceding deficiencies in the related art.

This application is achieved through the technical solution below.

This application relates to a micro-nano wire manufacturing device. The device includes a liquid-phase nanomaterial storage device and a micro-nano wire applying mechanism. The liquid-phase nanomaterial storage device is provided with a liquid outlet, and the micro-nano wire applying mechanism is provided in one-to-one correspondence with the liquid outlet. The micro-nano wire applying mechanism includes at least two flexible wires. The roots of the flexible wires are secured to the liquid-phase nanomaterial storage device. One ends of the two flexible wires hang down to a substrate and abut against each other. The range of the angle between the projections of the two flexible wires on the substrate is 1° to 5°.

This application relates to a micro-nano structure. The micro-nano structure includes a one-dimensional pattern composed of micro-nano wires. The micro-nano structure is disposed on a substrate and manufactured by the preceding micro-nano wire manufacturing device.

REFERENCE LIST

Figure 1:
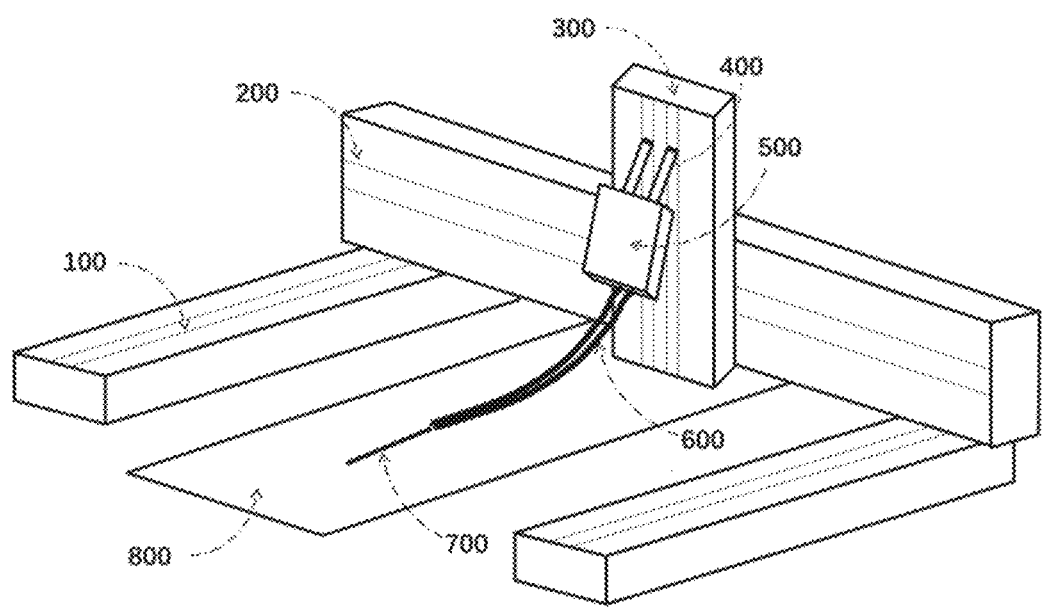
FIG. 1 is a schematic view illustrating the structure of embodiment one of the present application.

100 X-axis linear displacement mechanism
200 Y-axis linear displacement mechanism
300 Z-axis linear displacement mechanism
400 bracket
500 liquid-phase nanomaterial storage device
501 liquid outlet
600 animal hair
700 micro-nano wire
800 substrate

DETAILED DESCRIPTION

Hereinafter this application will be described in detail in conjunction with drawings and embodiments.

Embodiment One

Figure 2:
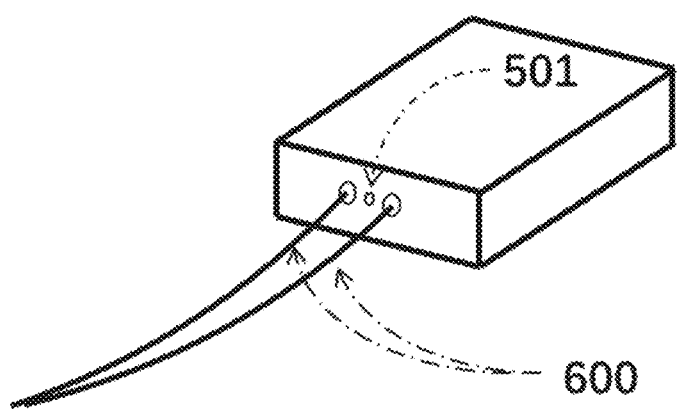
FIG. 2 is a schematic view illustrating the structure of the liquid-phase nanomaterial storage device of embodiment one of the present application.

As shown in FIGS. 1 and 2, this embodiment relates to a micro-nano wire manufacturing device. The device includes a pair of X-axis linear displacement mechanisms 100, a Y-axis linear displacement mechanism 200, a Z-axis linear displacement mechanism 300, and a liquid-phase nanomaterial storage device 500. A substrate 800 is disposed between the pair of X-axis linear displacement mechanisms 100. The liquid-phase nanomaterial storage device 500 is provided with a liquid outlet 501 and a micro-nano wire applying mechanism. The micro-nano wire applying mechanism is provided in one-to-one correspondence with the liquid outlet. The micro-nano wire applying mechanism optionally includes two animal hairs 600. The roots of the two animal hairs 600 are optionally bonded to the liquid-phase nanomaterial storage device 500. The liquid outlet 501 is disposed between the roots of the two animal hairs 600. The ends of the two animal hairs 600 hang down and abut against each other at the hanging portion. The range of the angle between the projections of the two animal hairs 600 on the substrate 800 is 1° to 5°.

It is to be noted that as shown in FIG. 2, that the micro-nano wire applying mechanism includes two animal hairs 600 means that two micro-nano wire applying mechanisms are provided, and each micro-nano wire applying mechanism may be one animal hair 600. Similarly, in some embodiments, that the micro-nano wire applying mechanism includes at least two flexible wires means that at least two micro-nano wire applying mechanisms are provided, and each micro-nano wire applying mechanism is one flexible wire.

It is to be understood that as shown in FIG. 2, that the two animal hairs 600 abut against each other at the hanging portion means that the ends of the two animal hairs 600 hang down to an end of the substrate 800, are against each other and are adjacent to each other. Similarly, in some embodiments, that one ends of two flexible wires hang down to the substrate and abut against each other means that the one ends of the two flexible wires hang down to the substrate, and the one ends of the two flexible wires hanging down to the substrate are against each other and adjacent to each other.

In some embodiments, the micro-nano wire applying mechanism optionally includes multiple groups of flexible wires (such as animal hairs 600), and each group includes two flexible wires.

In the same group of flexible wires, one ends of two flexible wires hang down to the substrate and abut against each other.

In some embodiments, the liquid-phase nanomaterial storage device 500 is connected to a motion actuator through a bracket, and the motion actuator is configured to drive the liquid-phase nanomaterial storage device 500 to move. In some embodiments, the surface of each flexible wire has regularly distributed microstructures.

In some embodiments, the liquid-phase nanomaterial storage device 500 is securely connected to the Z-axis linear displacement mechanism 300 through the bracket 400 and can move stably on the Z-axis linear displacement mechanism 300, the Z-axis linear displacement mechanism 300 is connected to the Y-axis linear displacement mechanism 200 and can move stably on the Y-axis linear displacement mechanism 200, the Y-axis linear displacement mechanism 200 is connected to the X-axis linear displacement mechanism 100 and can move stably on the X-axis linear displacement mechanism 100, and the X-axis linear displacement mechanism 100 is secured to a stable platform.

As shown in FIG. 1, in some embodiments, the motion actuator includes a pair of X-axis linear displacement mechanisms 100, a Y-axis linear displacement mechanism 200 erected on the pair of X-axis linear displacement mechanisms 100, and a Z-axis linear displacement mechanism 300 erected on the Y-axis linear displacement mechanism 200. The Z-axis linear displacement mechanism 300 is configured to drive and displace the liquid-phase nanomaterial storage device 500 in the extension direction of the Z-axis. The Y-axis linear displacement mechanism 200 is configured to drive and displace the liquid-phase nanomaterial storage device 500 and the Z-axis linear displacement mechanism 300 in the extension direction of the Y-axis. The X-axis linear displacement mechanisms 100 are configured to drive and displace the liquid-phase nanomaterial storage device 500, the Y-axis linear displacement mechanism 200, and the Z-axis linear displacement mechanism 300 in the extension direction of the X-axis.

It is to be understood that the X axis, the Y axis, and the Z axis are three coordinate axes perpendicular to each other.

In some embodiments, the X-axis linear displacement mechanisms 100, the Y-axis linear displacement mechanism 200, and the Z-axis linear displacement mechanism 300 are all programmable linear displacement mechanisms, such as linear motor modules, which can accurately control the movement direction and movement speed of the animal hairs 600 and the pressure of the animal hairs 600 relative to the substrate.

In some embodiments, the distance between the roots of the two animal hairs 600 is 1-3 mm.

The angle and distance between the animal hairs 600 and the substrate 800 can be adjusted through rotation of the liquid-phase nanomaterial storage device 500 relative to the bracket 400. In some embodiments, the angle between the tangent of the roots of the animal hairs 600 and the substrate 800 is 20°-70°, and the vertical distance from the roots to the substrate is less than 7 cm.

The operating principle of the embodiment of this application is as described below.

The liquid-phase nanomaterial flows into the gap between the two animal hairs 600 through the liquid outlet 501 under the action of gravity.

When the animal hair 600 contacts the substrate 800, the liquid-phase nanomaterial in the gap is continuously and controllably transferred to the substrate 800 under the action of gravity, the Laplace pressure difference and the asymmetric retention force, so that a micro-nano wire 700 with a uniform width is formed. The micro-nano wire 700 has the same functional properties as the liquid-phase nanomaterial.

The shape of the micro-nano wire 700 varies with the motion track of the animal hairs 600. The width and thickness of the micro-nano wire 700 can be both under nanoscale control. The thickness of the micro-nano wire 700 depends on the movement speed, the length of the hairs and the surface tension of the liquid. In some embodiments, the micro-nano wire 700 has a width of 50-1000 nm and a thickness of 40-150 nm.

In some embodiments, each flexible wire may be made of animal hair.

In some embodiments, the liquid-phase nanomaterial storage device stores a liquid-phase nanomaterial which includes at least one of a quantum dot material, a fluorescent material, or a conductive and high-molecular-weight polymer material.

In some embodiments, the substrate is any one of a silicon-based material or a flexible material. Optionally, the flexible material may be a planar structure or a curved structure.

In some embodiments, the liquid-phase nanomaterial storage device is connected to the motion actuator through a bracket. Optionally, the liquid-phase nanomaterial storage device is rotatable up and down on the bracket, and the natural hanging angle of each flexible wire can be adjusted by the rotation. Optionally, a hinge structure with a controllable rotation angle is adopted.

In some embodiments, the motion actuator includes a pair of X-axis linear displacement mechanisms, a Y-axis linear displacement mechanism erected on the pair of X-axis linear displacement mechanisms, and a Z-axis linear displacement mechanism erected on the Y-axis linear displacement mechanism. The Z-axis linear displacement mechanism is used to control the pressure of each flexible wire relative to the substrate, thereby controllingso that the width of the micro-nano wire is controlled.

In some embodiments, the motion actuator may be a robot, such as a parallel robot or a serial robot.

Compared with the related art, this application has the advantages below.

1. The micro-nano wire can be rapidly manufactured based on the gravity of the liquid-phase nanomaterial, the Laplace pressure difference with the flexible wires, and the asymmetric retention force.
2. The movement direction and movement speed of the flexible wires and the pressure of the flexible wires relative to the substrate can be controlled so that the width and thickness of the manufactured micro-nano wire can be accurately controlled, and the physical and chemical properties of the micro-nano wire can be guaranteed.
3. The flexible wires can be moved stably so that a uniform micro-nano wire can be manufactured on a substrate of any shape, especially a flexible or curved substrate. In this manner, this application has great application prospects in the production of wearable and implantable electronic devices.
4. The materials and components can be selected in a wide range with low costs, low requirements of manufacturing conditions, simple process and large area of production.

What is claimed is:

1. A micro-nano wire manufacturing device, comprising:
a liquid-phase nanomaterial storage device; and
a micro-nano wire applying mechanism, wherein
the liquid-phase nanomaterial storage device is provided with a liquid outlet, and the micro-nano wire applying mechanism is provided in one-to-one correspondence with the liquid outlet, and
the micro-nano wire applying mechanism comprises at least two flexible wires, roots of the flexible wires are secured to the liquid-phase nanomaterial storage device, one end of one of two flexible wires of the at least two flexible wires and one end of the other one of the two flexible wires of the at least two flexible wires abut against each other and hang down to a substrate, and a range of an angle between projections of the two flexible wires on the substrate is 1° to 5°,
wherein the liquid outlet is located between roots of the two flexible wires of the at least two flexible wires.

2. The micro-nano wire manufacturing device of claim 1, wherein the substrate is a silicon-based material or a flexible material.

3. The micro-nano wire manufacturing device of claim 1, wherein the at least two flexible wire are made of animal hair.

4. The micro-nanowire manufacturing device of claim 1, wherein the liquid-phase nanomaterial storage device is connected to a motion actuator through a bracket.

5. The micro-nano wire manufacturing device of claim 4, wherein the liquid-phase nanomaterial storage device is rotatable up and down on the bracket.

6. The micro-nano wire manufacturing device of claim 4, wherein the liquid-phase nanomaterial storage device is disposed on the bracket through a hinge structure with a controllable rotation angle.

7. The micro-nano wire manufacturing device of claim 4, wherein the liquid-phase nanomaterial storage device is configured to store a liquid-phase nanomaterial which comprises at least one of a quantum dot material, a fluorescent material, and a conductive polymer material.

8. The micro-nano wire manufacturing device of claim 4, wherein the motion actuator comprises a pair of X-axis linear displacement mechanisms, a Y-axis linear displacement mechanism erected on the pair of X-axis linear displacement mechanisms, and a Z-axis linear displacement mechanism erected on the Y-axis linear displacement mechanism.

9. The micro-nano wire manufacturing device of claim 5, wherein the liquid-phase nanomaterial storage device is disposed on the bracket through a hinge structure with a controllable rotation angle.

\* \* \* \* \*